(12) United States Patent
Foote

(10) Patent No.: US 6,218,292 B1
(45) Date of Patent: Apr. 17, 2001

(54) DUAL LAYER BOTTOM ANTI-REFLECTIVE COATING

(75) Inventor: David K. Foote, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/993,126

(22) Filed: Dec. 18, 1997

(51) Int. Cl.$^7$ ................................................ H01L 21/4763
(52) U.S. Cl. ..................... 438/636; 438/786; 438/952; 427/126.3; 427/99
(58) Field of Search ..................... 438/636, 952, 438/786; 430/315, 311; 427/126.3, 99

(56) References Cited

U.S. PATENT DOCUMENTS

| | | | |
|---|---|---|---|
| 5,710,067 | * | 1/1998 | Foote et al. ........................... 438/636 |
| 6,037,276 | * | 3/2000 | Lin et al. ............................... 438/786 |
| 6,057,587 | * | 5/2000 | Ghandehari et al. ................. 257/437 |

OTHER PUBLICATIONS

T. Tanaka et al., "A New Photolithography Technique with Antireflective Coating on Resist: ARCOR," J. Electrochem. Soc., vol. 137, No. 12, Dec. 1990, pp. 3900–3905.

T. Ogawa et al., "SiO$_x$N$_y$:H, high performance anti–reflective layer for current and future optical lithography," (6 pages) vol. 2197, SPIE, 1994.

T. Gocho et al., "Chemical Vapor Deposition of Anti–Reflective Layer Film for Excimer Laser Lithography," Japanese Journal of Applied Physics, vol. 33, Jan. 1994, Pt. 1, No. 1B, pp. 486–490.

Benchor et al., "Dielectric Anti–Reflective Coatings for DUV Lithography," Solid State Technology, Mar. 1997, pp. 110–114.

Armacost, "Selective Oxide: Nitride Dry Etching in a High Density Plasma Reactor," Abstract No. 252, pp. 369–370.

* cited by examiner

*Primary Examiner*—Charles Bowers
*Assistant Examiner*—Erik J Kielin

(57) ABSTRACT

Photolithographic processing is enhanced by employing a composite comprising two bottom anti-reflective coatings, wherein the extinction coefficient (k) of the upper anti-reflective coating is less than that of the underlying anti-reflective coating. The use of a composite bottom anti-reflective coating comprising partially transparent upper anti-reflective coating substantially reduces reflective notching in the photoresist layer, particularly when employing i-line or deep UV irradiation to obtain sub 0.35 µm features.

16 Claims, 5 Drawing Sheets

DUAL LAYER BOTTOM ANTI-REFLECTIVE COATING

TECHNICAL FIELD

The present invention relates to a method of manufacturing a semiconductor device employing an anti-reflective coating during photolithography. The invention is particularly applicable to the manufacture of semiconductor devices having sub 0.35 µm circuitry.

BACKGROUND ART

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. The increasing demands for high densification impose correspondingly high demands on photolithographic techniques.

During the manufacture of a semiconductor device, light from the stepper is passed through a mask and the pattern transferred to the underlying photoresist layer. However, when the substrate underlying the photoresist layer is highly reflective, e.g., metal and polysilicon layers, light reflections can destroy the pattern resolution by several mechanisms, including off-normal incident light reflected back from the photoresist that is intended to be masked, incident light reflected off device features exposing "notches" in the photoresist, and thin film interference effects leading to linewidth variations when photoresist thickness changes are caused by irregular wafer topography.

Photolithographic techniques conventionally employed during various phases in the manufacture of semiconductor devices comprise forming an anti-reflective coating (ARC), also characterized as an anti-reflective layer (ARL), typically a bottom ARC positioned between a substrate, e.g., a dielectric or conductive layer, and a photoresist layer. ARCs are conventionally made of various materials, including organic and inorganic materials. For example, inorganic materials conventionally employed for ARCs include silicon nitride, silicon oxynitride, α-carbon, titanium nitride, silicon carbide and amorphous silicon. Organic materials conventionally employed for ARCs include spin-on polyimides and polysulfones. Conventional ARCs are designed by appropriate adjustment of variables such as composition, deposition conditions and reaction conditions, to exhibit the requisite optical parameters, e.g., index of refraction (n) and extinction coefficient (k), to suppress multiple interference effects caused by the interference of light rays propagating in the same direction due to multiple reflections in the photoresist layer. The effective use of an ARC enables patterning and alignment without disturbance caused by such multiple interference effects, thereby improving linewidth accuracy and alignment, critical factors with respect to achieving fine line conductive patterns with minimal interwiring spacing. The use of an ARC is particularly significant when forming a via or contact hole over a stepped area, as when etching a dielectric layer deposited on a gate electrode and gate oxide formed on a semiconductor substrate in manufacturing a field effect transistor. The physics involved in ARCs is known and the use of ARCs is conventional and, hence, will not be set forth herein detail. See, for example, T. Tanaka et al., "A New Photolithography Technique with Antireflective Coating on Resist: ARCOR," J. Electrochem. Soc., Vol. 137, No. 12, December 1990, pp. 3900–3905.

ARCs have improved the accuracy of ultra-violet and deep ultra-violet lithography, and expanded the use of ion beam, I-line, KrF and ArF excimer laser lithography. T. Ogawa et al., "$SiO_xN_y$:H, high performance anti-reflective layer for current and future optical lithography." Efforts have been made to engineer the optical parameters of an ARC, as by adjusting process variables impacting the refractive index during plasma enhanced chemical vapor deposition (PECVD). T. Gocho et al., "Chemical Vapor Deposition of Anti-Reflective Layer Film for Excimer Laser Lithography," Japanese Journal of Applied Physics, Vol. 33, January 1994, Pt. 1, No. 1B, pp. 486–490.

In copending application U.S. Pat. No. 5,710,067 filed on Jun. 7, 1996, an anti-reflective film comprising silicon oxime having the formula $Si_{1-(x+y+z)}N_xO_yH_z$, wherein x, y and z represent the atomic percentage of nitrogen, oxygen and hydrogen, respectively, is disclosed for use as an ARC. The disclosed silicon oxime ARC typically comprises 15–20 at. % oxygen and about 10–20 at. % hydrogen, and is formed employing a stoichiometric excess of nitrogen sufficient to substantially prevent bonding between silicon atoms and oxygen atoms.

Conventional techniques for manufacturing a semiconductor employ various types of ARCs, including a bottom ARC formed beneath the photoresist layer to reduce substrate reflections, and a top ARC deposited over the photoresist layer to reduce second-auto reflections. Bottom ARCs have emerged as the most effective in reducing reflections while interfering the least with the photolithographic processes. A conventional application of a bottom dielectric ARC is schematically illustrated in FIG. 1, wherein dielectric bottom ARC 11 is formed on substrate 10, which substrate 10 comprises either a dielectric layer or conductive layer. A photoresist layer 12 is formed on bottom ARC 11 and exposed through a patterned mask (not shown) to irradiation 13. The reflected light, cancelled by a phase-shift cancellation at one-half wavelength, is shown by arrows 13A and 13B.

As design specifications are reduced below 0.35 µm, greater demands are placed upon the already strained requirements of photolithography. For example, as design features shrink below 0.35 µm, ARCs are required to suppress more than 99% of substrate-reflected light, meet stringent photoresist and device contamination requirements and operate at extended UV wavelengths. Such requirements cannot be met by conventional ARCs. For example, with features shrinking well below 0.35 µm and stepper productions systems shifting to shorter wavelengths, many conventional bottom ARCs result in reflective notching and no longer maintain acceptable linewidth variations. Conventional approaches resort to chemical vapor deposited dielectric ARCs and fine tuning optical parameters, such as the index of refraction (n) and extinction coefficient (k), as well as optimizing the thickness (d) of the ARC. See, for example, Benchor et al., "Dielectric Anti-Reflective Coatings for DUV Lithography," Solid State Technology, March 1997, pp. 110–114. Notwithstanding such efforts, conventional photolithographic capabilities constitute a severe limiting factor in reducing the design rule or maximum dimension below 0.35 µm, particularly when forming a pattern on a substantially transparent dielectric substrate.

Conventional deep UV lithography utilizes bottom ARCs comprising both spin on films as well as various compounds of silicon, oxygen and/or nitrogen, e.g., silicon nitrides, silicon oxides and silicon oxynitrides. Such bottom anti-reflective coatings have been relatively successful in modifying or eliminating the amount of reflective energy from a substrate into a photoresist layer when the underlying substrate is optically infinite, i.e., when the substrate will only reflect incident energy, such as i-line or deep UV irradiation, from its top surface. However, a substrate or film that is not optically infinite will reflect and/or transmit energy at every interface within the substrate. Such reflections result in what is known as "reflective notching" which contributes to poor circuit design control.

Reflective notching is schematically illustrated in FIG. 2, wherein dielectric layer 20, e.g., a layer of boron phosphorous tetraethoxy silicate (BPSG), is applied over structures 21 and 22. Structure 21 comprises sequentially formed first polysilicon layer 21A, dielectric layer 21B, second polysilicon layer 21C, metal silicide layer 21D, such as tungsten silicide, and polysilicon layer 21E. Structure 22 comprises sequentially formed first polysilicon layer 22A, metal silicide layer 22B, such as tungsten silicide, and polysilicon layer 22C. Structures 21 and 22 extend to different heights above interface 23 on which dielectric layer 20 is formed. Photoresist layer 24 is deposited on dielectric layer 20 forming interface 25 therebetween. Upon exposure to irradiation 26, it is apparent that reflected light from different surfaces, i.e., 26A, 26B and 26C, is scattered back to interface 25 at various angles along with random interference patterns causing undesirable reflective notching in photoresist layer 24.

Accordingly, there exists a need for photolithographic techniques, particularly improved bottom ARCs for use in patterning substantially transparent substrates. There exists an even greater need for improved bottom ARCs to enable accurate control of submicron features, particularly below 0.35 microns, particularly for use in patterning a photoresist layer on a relatively transparent dielectric substrate.

DISCLOSURE OF THE INVENTION

An object of the present invention is a method of manufacturing a semiconductor device with submicron design features and high photolithographic reliability.

Another object of the present invention is a photolithographic technique employing a bottom ARC for improved control of fine line patterns and reduced reflective notching.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: depositing a first anti-reflective coating on a substrate; depositing a second anti-reflective coating on the first anti-reflective coating, wherein the second anti-reflective coating exhibits greater transparency than the first anti-reflective coating; and depositing a photoresist layer on the second anti-reflective coating.

Another aspect of the present invention is a method of manufacturing a semiconductor device, which method comprises: depositing a first anti-reflective coating on a substrate; depositing a second anti-reflective coating on the first anti-reflective coating; wherein the second anti-reflective coating has an extinction coefficient (k), e.g., 1.0, which is less than the extinction coefficient (k), e.g., 0.3, of the first anti-reflective coating; and depositing a photoresist layer on the second anti-reflective coating.

A further aspect of the present invention is an intermediate article formed during manufacturing a semiconductor device, which intermediate article comprises: a dielectric substrate; a first anti-reflective coating on the substrate; a second anti-reflective coating on the first anti-reflective coating, wherein the second anti-reflective coating has an extinction coefficient (k) less than the extinction coefficient (k) of the first anti-reflective coating; and a photoresist layer on the second anti-reflective coating.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The increasing demands for accurate fine line patterns, minimal interwiring spacings, and reliable interlayer contacts and vias, require expansion of the capabilities and improvements in the accuracy of photolithographic techniques. The limitations on design rule features imposed by photolithographic technology can be overcome by strategically structuring bottom ARCs. The present invention comprises the formation and use of a composite ARC having strategically designed optical qualities which enhance the accurate control of design features below 0.35 μm. The present invention is particularly effective in solving the reflective notching in a photoresist layer applied to a substantially transparent substrate containing various topographical features therein, such as topographical features at different depths within the substrate.

Figure 1:
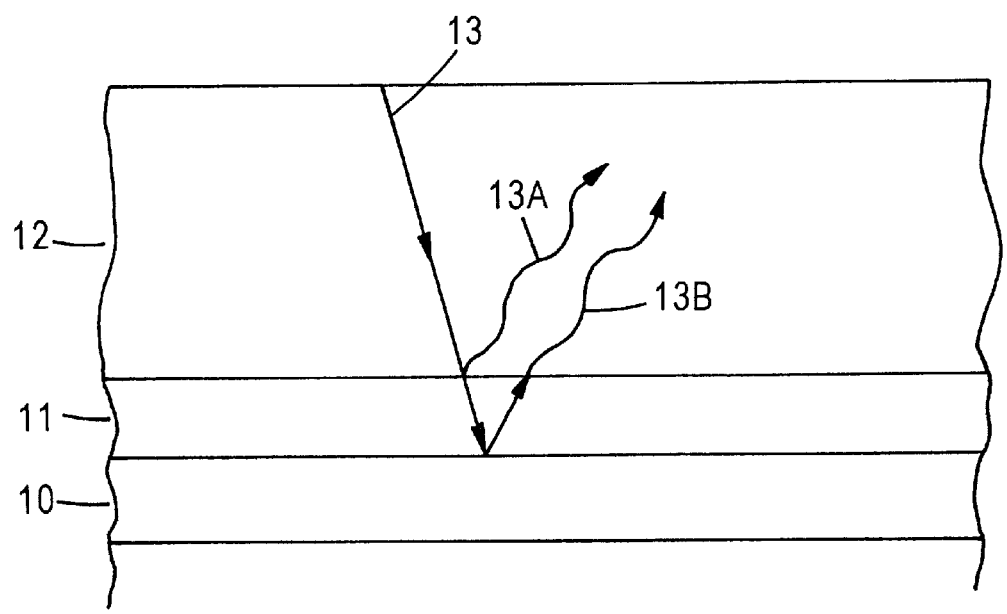
FIG. 1 schematically illustrates the use of a conventional bottom ARC.
Figure 2:
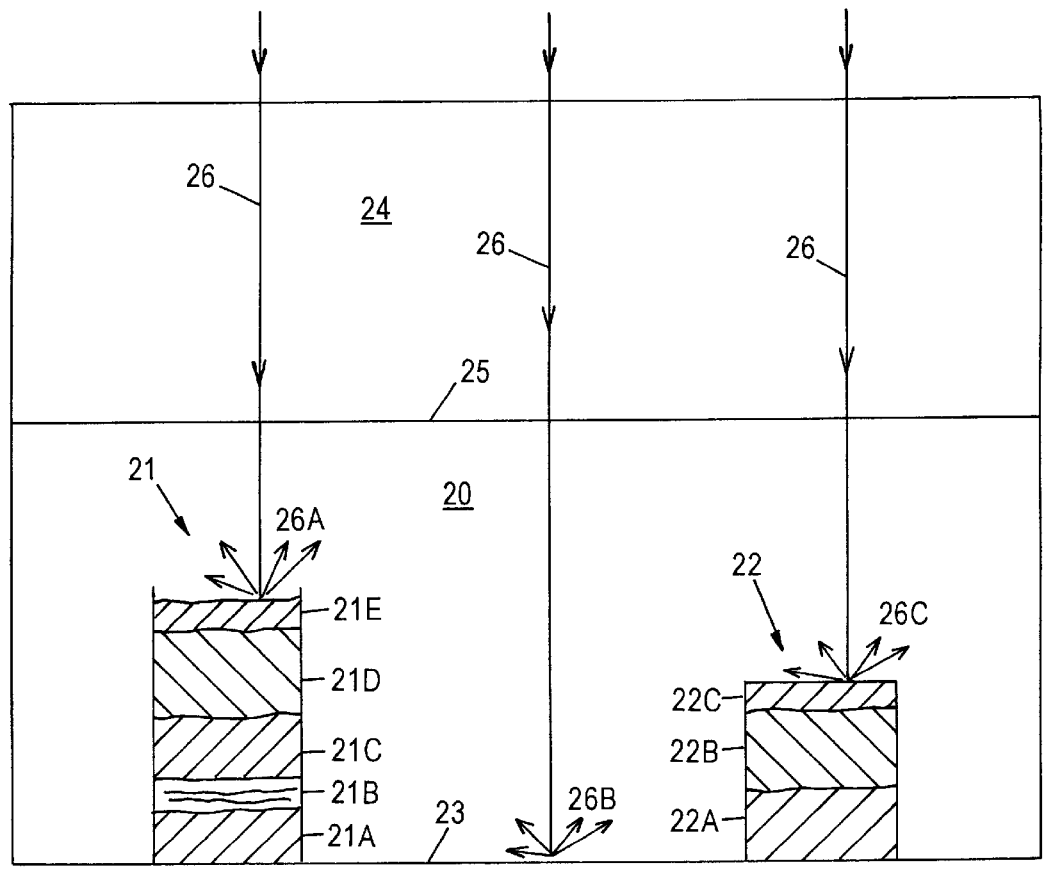
FIG. 2 schematically illustrates the source of notching due to reflections from irregular topographical features in a substantially transparent dielectric layer.
Figure 3:
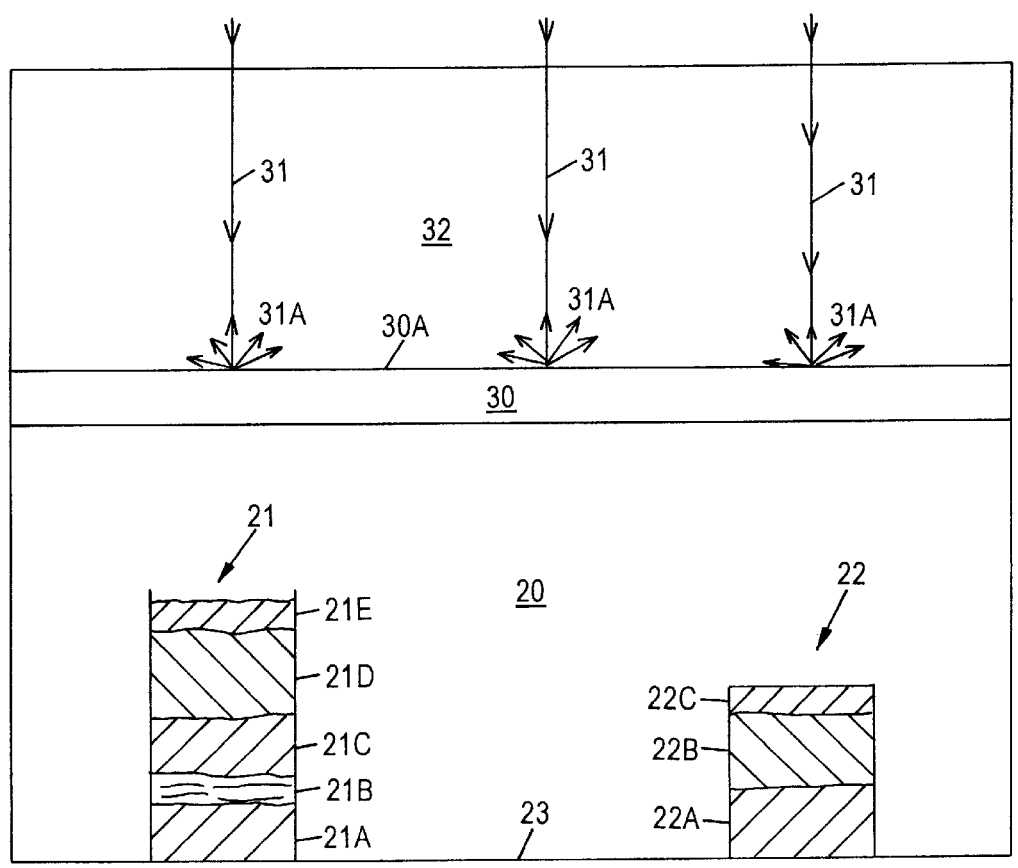
FIG. 3 schematically illustrates the use of an optically infinite bottom ARC.

As the first approach to the reflective notching problem, an optically infinite bottom ARC was applied to a substantially transparent substrate containing different topographical features, such as the situation schematically illustrated in FIG. 2. The approach employing an optically infinite bottom ARC is schematically illustrated in FIG. 3, wherein elements similar to elements in FIG. 2 bear similar reference numerals. Adverting to FIG. 3, an optically infinite bottom ARC 30 is formed on substantially transparent substrate 20 containing topographical structures 21 and 22 at different heights above substrate surface 23 upon which dielectric layer 20 is applied. Optically infinite bottom ARC 30 was formed of a silicon oxime film with an extinction coefficient (k) of about 0.3. Irradiating beams 31 impinge on optically infinite bottom ARC 30 and reflect from the surface thereof 30A as reflected beams 31A. The attempted solution illustrated in FIG. 3 did not prove successful, in that irregularities due to reflective etching were formed in the profile of the photoresist pattern.

After extensive research and experimentation, the reflective notching problem was successfully resolved by formulating a composite bottom ARC. In accordance with an embodiment of the present invention, a composite bottom ARC is formed comprising a first lower ARC on the surface of a relatively transparent substrate and a second upper ARC on the surface of the first lower ARC. The first and second ARCs are strategically formulated and optically designed to eliminate reflections from the interface with a photoresist layer into the photoresist layer by total destructive interference, thereby avoiding the occurrence of reflective notching.

In an embodiment of the present invention, a first ARC is formed on a substantially transparent dielectric substrate, and a second ARC, exhibiting greater transparency than the first ARC, is formed on the first ARC, as by conventional deposition techniques, e.g., chemical vapor deposition. A photoresist layer is formed on the composite bottom ARC. The photoresist layer is image-wise exposed, as by i-line or deep UV irradiation, through a photomask to define a pattern which is developed in a conventional manner. Etching is then conducted through the underlying composite bottom ARC to transfer the pattern to the underlying substantially transparent dielectric substrate.

The relative transparencies of the first and second ARCs of the composite bottom ARC of the present invention can be optimized in a particular situation depending upon, inter alia, the nature and degree of transparency of the underlying substrate, by suitable adjustment of the thickness and optical properties. For example, a second ARC can be advantageously formed with an extinction coefficient (k) less than the extinction coefficient (k) of first ARC. When employing a substantially transparent substrate and depositing a composite bottom ARC in accordance with the present invention, it has been found suitable to form the first ARC with an extinction coefficient (k) of about 1 to about 2, and to form the second ARC with an extinction coefficient (k) of about 0.3 to about 0.7.

The first and second ARCs of composite bottom ARC of the present invention can comprise any of various dielectric materials, such as silicon nitrides, silicon oxynitrides and silicon oximes, preferably silicon oxime such as the silicon oxime disclosed in copending application U.S. Pat. No. 5,710,067, the entire disclosure of which is incorporated herein by reference.

Accordingly, an embodiment of the present invention comprises the formation of a bottom composite ARC comprising first and second ARCs, either or both comprising silicon oxime having a formula:

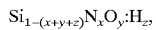

$$Si_{1-(x+y+z)}N_xO_y:H_z,$$

wherein x, y and z represent the atomic percentage of nitrogen, oxygen and hydrogen, respectively. Preferably the silicon oxime comprises about 10 to about 20 at. % hydrogen.

In forming a bottom composite silicon oxime ARC in accordance with the present invention, the first ARC can comprise substantially optically infinite silicon oxime, with an extinction coefficient (k) of about 1 to about 2, while the second ARC can comprise silicon oxime with an extinction coefficient (k) less than that of the first silicon oxime ARC, e.g., about 0.3 to about 0.7. In other embodiments of the present invention, the first ARC of the composite bottom ARC can comprise a substantially optically infinite material, such as a metal, polysilicon, amorphous silicon or silicon nitride.

The present invention also comprises an intermediate article formed during the manufacture of a semiconductor device. Such an intermediate article comprises a dielectric substrate, such as a substantially transparent dielectric substrate, with a composite bottom ARC formed thereon in accordance with the present invention, wherein the composite ARC comprises a first ARC on the dielectric substrate and a second upper ARC on the first ARC. The second upper ARC is formulated with an extinction coefficient (k) less than the extinction coefficient (k) of the first lower ARC. The intermediate article of the present invention further comprises a photoresist layer formed on the second upper ARC of the composite bottom ARC.

Figure 4:
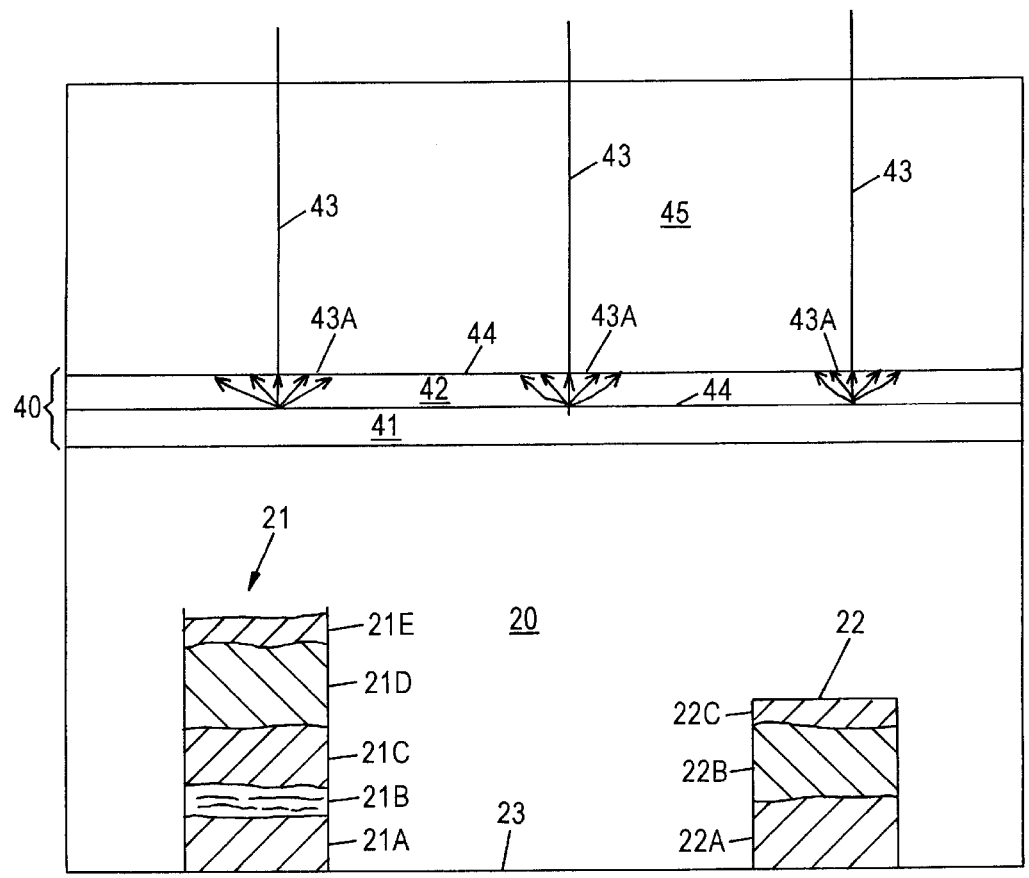
FIG. 4 illustrates an embodiment of the present invention employing a composite bottom ARC.

An embodiment of the present invention is depicted in FIG. 4, wherein elements similar to the elements illustrated in FIGS. 2 and 3 bear similar reference numerals. As schematically illustrated in FIG. 4, a composite bottom ARC 40, is formed on transparent dielectric substrate 20 containing topographical structures 21 and 22 extending to different heights above interface 23 on which dielectric layer 20 is formed. Composite bottom ARC 40 comprises first ARC 41 and second ARC 42 formed on first ARC 41. The second upper ARC 42 is formulated to exhibit greater transparency than the first lower ARC 41 which can be optically transparent.

Figure 5:
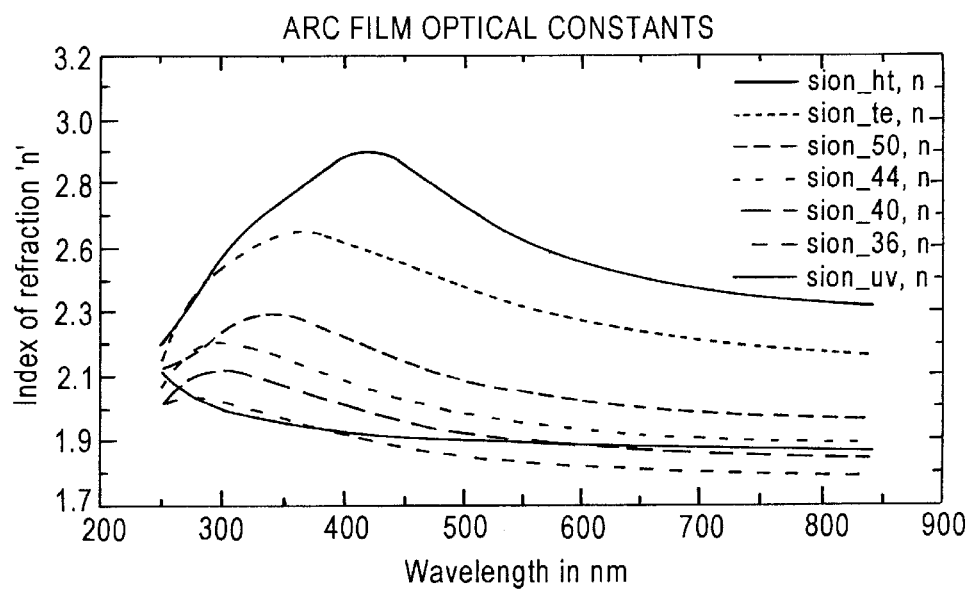
FIGS. 5 and 6 are graphs of the index of refraction (n) and extinction coefficient (k), respectively, as a function of wavelength for silicon oxime films.
Figure 6:
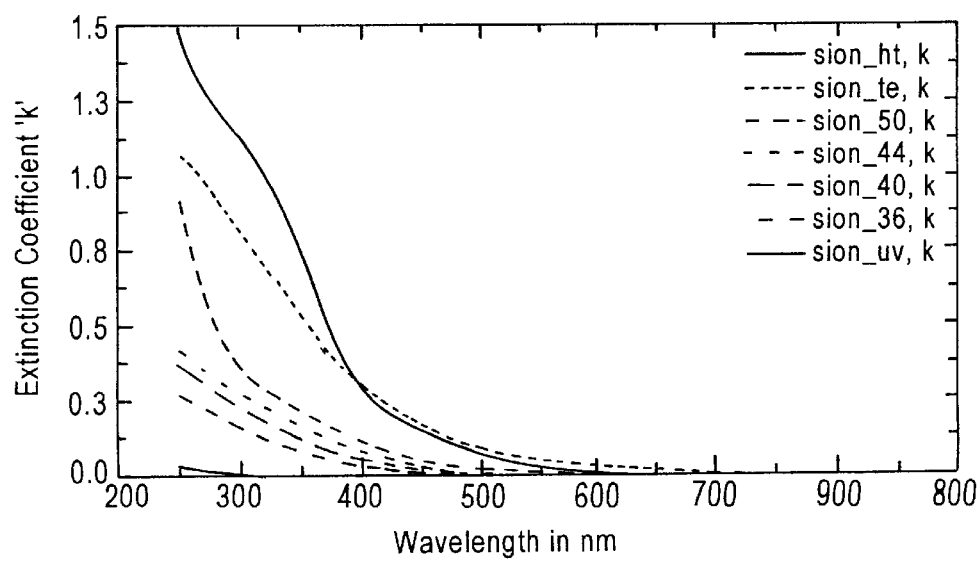

The thickness of the first and second ARCs, particularly the thickness of the second ARC 42, is optimized to achieve 180° out of phase reflections, thereby eliminating reflections into the photoresist layer 45. As schematically illustrated in FIG. 4, beams 43A are reflected at the interface 44 between the first and second ARCs of composite bottom ARC 40, wherein total destructive interference occurs. By selecting an appropriate film thickness for second ARC 42 and optimizing the extinction coefficients for second ARC 42 vis-à-vis first ARC 41, substantial interference is obtained between the phase of the energy into the photoresist layer 45 and initial reflections. As one having ordinary skill in the art would also understand, the thickness, index of refraction (n) and extinction coefficient (k) for a particular anti-reflective material can be optimized to achieve the desirable total destructive interference so that light energy does not leave the interface 44 between the photoresist layer 22 and the composite bottom ARC 40. FIGS. 5 and 6 present indices of refraction (n) and extinction coefficients (k), respectively, for silicon oxime films ranging from substantially optically transparent to substantially optically infinite.

In carrying out the present invention, conventional materials and processing techniques can be employed and, hence, such conventional aspects are not set forth herein in detail. For example, etching of the underlying dielectric layer is conducted in a conventional manner. One having ordinary skill in the art could easily select suitable photoresist materials and etchants, and employ suitable deposition and etching techniques.

In accordance with the present invention, a composite bottom ARC is formed having a first lower ARC and a second ARC with optimized optical properties to substantially eliminate reflective notching, particularly reflective notching caused by different topographic features within an underlying substantially transparent dielectric substrate. The present invention is applicable to various phases of semiconductor manufacturing wherein a substrate, such as a dielectric layer, is etched, as in damascene techniques.

Only the preferred embodiment of the invention and but an example of its versatility is shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

depositing a first anti-reflective coating on a substrate;

depositing a second anti-reflective coating on the first anti-reflective coating, wherein the second anti-reflective coating exhibits greater transparency than the first anti-reflective coating; and depositing a photoresist layer on the second anti-reflective coating, wherein: the second anti-reflective coating has an extinction coefficient (k) which is less than the extinction coefficient (k) of the first anti-reflective coating; and the first and/or second anti-reflective coating comprise silicon oxime having the formula: $Si_{1-(x+y+z)}N_xO_y:H_z$, wherein x, y and z represent the atomic percentage of nitrogen, oxygen and hydrogen, respectively.

2. The method according to claim 1, wherein:

the first anti-reflective coating has an extinction coefficient (k) of about 1 to about 2;

the second anti-reflective coating has an extinction coefficient of about 0.3 to about 0.7; and the substrate is substantially transparent.

3. The method according to claim 1, wherein the silicon oxime comprises about 10 to about 20 at. % hydrogen.

4. The method according to claim 1, wherein the first anti-reflective coating comprises a substantially optically infinite layer of silicon oxime, having an extinction coefficient (k) of about 1 to about 2.

5. The method according to claim 1, wherein the first anti-reflective coating is substantially optically infinite.

6. The method according to claim 5, wherein the first anti-reflective coating comprises a metal, silicon oxime, polysilicon, amorphous silicon or silicon nitride.

7. The method according to claim 1, wherein the substrate comprises a substantially transparent dielectric layer.

8. The method according to claim 7, wherein the dielectric layer comprises silicon oxide.

9. The method according to claim 7, wherein the dielectric layer contains at least one topographical structure therein.

10. The method according to claim 9, wherein the dielectric layer contains at least two structures therein having different topographical features.

11. The method according to claim 10, wherein the two structures differ in height.

12. The method according to claim 7, further comprising:

image-wise exposing the photoresist layer to i-line or deep UV radiation through a photomask defining a pattern;

developing the pattern; and etching the underlying composite anti-reflective coating and dielectric layer to transfer the pattern to the dielectric layer.

13. The method according to claim 1, wherein the substrate comprises a dielectric layer, the method further comprising:

exposing the photoresist layer to irradiation to define a pattern;

developing the pattern; and etching the underlying composite anti-reflective coating and dielectric layer; wherein the dielectric layer is substantially transparent, and the extinction coefficient (k), index of refraction (n) and thickness of the first and second anti-reflective layers are selected to substantially eliminate any reflections back into the photoresist layer.

14. An intermediate article formed during manufacturing a semiconductor device, which intermediate article comprises:

a dielectric substrate;

a first anti-reflective coating on the substrate;

a second anti-reflective coating on the first anti-reflective coating wherein the second anti-reflective coating has an extinction coefficient (k) less than the extinction coefficient (k) of the first anti-reflective coating; and a photoresist layer on the second anti-reflective coating, wherein:

the substrate is substantially transparent;

the first anti-reflective coating has an extinction coefficient (k) of about 1 to about 2;

the second anti-reflective coating has an extinction coefficient (k) of about 0.3 to about 0.7; and the first anti-reflective coating and/or second anti-reflective coating comprise silicon oxime having the formula $Si_{1-(x+y+z)}N_xO_y:H_z$, wherein x, y and z represent the atomic percentage of nitrogen, oxygen and hydrogen, respectively.

15. The intermediate article according to claim 14, wherein the first anti-reflective coating comprises substantially optically infinite silicon oxime having an extinction coefficient (k) of about 1 to about 2.

16. The intermediate article according to claim 14, wherein the first anti-reflective coating is substantially optically infinite and comprises a metal, silicon oxime, polysilicon, amorphous silicon or silicon nitride.

* * * * *